US007733433B2

(12) United States Patent
Kim

(10) Patent No.: US 7,733,433 B2
(45) Date of Patent: Jun. 8, 2010

(54) LIQUID CRYSTAL DISPLAY HAVING A REDUCED NUMBER OF DATA DRIVING CIRCUIT CHIPS

(75) Inventor: Dong-Gyu Kim, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 317 days.

(21) Appl. No.: 11/517,521

(22) Filed: Sep. 7, 2006

(65) Prior Publication Data

US 2007/0057257 A1    Mar. 15, 2007

(30) Foreign Application Priority Data

Sep. 15, 2005   (KR)   ............ 10-2005-0086257

(51) Int. Cl.
G02F 1/136    (2006.01)
(52) U.S. Cl. ............................................. 349/43
(58) Field of Classification Search ............ 349/43, 349/139–152
See application file for complete search history.

(56) References Cited

U.S. PATENT DOCUMENTS

| 5,886,756 | A  | * | 3/1999 | Lee ......................... 349/39 |
| 6,014,190 | A  | * | 1/2000 | Kim et al. ................. 349/39 |
| 6,249,326 | B1 |   | 6/2001 | Hebiguchi |
| 6,680,761 | B1 |   | 1/2004 | Greene et al. |
| 2004/0080679 | A1 | * | 4/2004 | Song et al. ................ 349/43 |
| 2004/0125258 | A1 | * | 7/2004 | Moon et al. ................ 349/43 |
| 2004/0125259 | A1 | * | 7/2004 | Cho ........................ 349/43 |
| 2006/0131585 | A1 | * | 6/2006 | Kim et al. ................. 257/66 |
| 2006/0203172 | A1 | * | 9/2006 | Baek et al. ............... 349/146 |

FOREIGN PATENT DOCUMENTS

| CN | 1304055 | 7/2001 |
| CN | 1427391 | 7/2003 |
| CN | 1445583 | 10/2003 |
| JP | 04-083231 | 3/1992 |
| JP | 11-133463 | 5/1999 |
| JP | 11-167127 | 6/1999 |
| JP | 2000-171830 | 6/2000 |
| JP | 2001-222026 | 8/2001 |
| JP | 2001-222027 | 8/2001 |
| JP | 1020010096154 A | 11/2001 |
| JP | 2002-049048 | 2/2002 |
| JP | 2002-303873 | 10/2002 |
| JP | 2003-222890 | 8/2003 |

* cited by examiner

*Primary Examiner*—Charlie Peng
(74) *Attorney, Agent, or Firm*—F. Chau & Associates, LLC

(57) ABSTRACT

A liquid crystal display includes a substrate, a plurality of gate lines formed on the substrate, a plurality of data lines intersecting the plurality of gate lines, a plurality of thin film transistors connected to the plurality of gate lines and the plurality of data lines, and a plurality of pixel electrodes connected to the plurality of thin film transistors and arranged in a matrix, wherein each of the pixel electrodes includes a first side parallel to each gate line and a second side being shorter than the first side, the second side being formed next to the first side, wherein the plurality of pixel electrodes that are adjacent to each other in a column direction are connected to different data lines from each other.

17 Claims, 8 Drawing Sheets

LIQUID CRYSTAL DISPLAY HAVING A REDUCED NUMBER OF DATA DRIVING CIRCUIT CHIPS

CROSS-REFERENCE TO RELATED APPLICATION

This application claims priority to Korean Patent Application No. 10-2005-0086257 filed on Sep. 15, 2005, the contents of which are incorporated herein by reference in their entirety.

BACKGROUND OF THE INVENTION (a) Technical Field

The present disclosure relates to a liquid crystal display, and more particularly to a liquid crystal display having a reduced number of data driving circuit chips.

(b) Discussion of the Related Art

Liquid crystal displays (LCDs) are widely used flat panel displays. An LCD may include two panels provided with field-generating electrodes such as, for example, pixel electrodes and a common electrode, and a liquid crystal layer interposed therebetween. The LCD displays images by applying voltages to the field-generating electrodes to generate an electric field in the liquid crystal layer, thereby determining the orientations of the liquid crystal molecules in the liquid crystal layer and adjusting polarization of incident light.

The LCD includes switching elements connected to respective pixel electrodes, and a plurality of signal lines such as gate lines and data lines for controlling the switching elements to apply voltages to the pixel electrodes. The gate lines transmit gate signals generated by a gate driving circuit and the data lines transmit data voltages generated by a data driving circuit. The switching elements transmit the data voltages to the pixel electrodes in response to the gate signals.

The gate driving circuit and the data driving circuit may be implemented as a plurality of integrated circuit (IC) chips directly mounted on the panel or mounted on a flexible circuit film, which is attached to the panel. Since the manufacturing cost of data driving circuit chips for use in an LCD are expensive and the data driving circuit is difficult to integrate into the panel, there is a need to reduce a number of the data driving circuit chips.

SUMMARY OF THE INVENTION

An exemplary embodiment of the present invention provides a liquid crystal display including a substrate, a plurality of gate lines formed on the substrate, a plurality of data lines intersecting the gate lines, a plurality of thin film transistors connected to the gate lines and the data lines, and a plurality of pixel electrodes connected to the thin film transistors and arranged in a matrix. Each of the pixel electrodes may include a first side parallel to each gate line and a second side that is shorter than the first side and is next to the first side, wherein pixel electrodes that are adjacent to each other in a column direction can be connected to different data lines from each other.

The liquid crystal display may further include storage electrode lines of which at least a portion of each overlaps a pixel electrode.

The storage electrode lines may extend perpendicular to the gate lines.

The storage electrode lines may be located in a same layer as the data lines.

The storage electrode lines may include a first part located in the same layer as the gate lines and disposed between two adjacent gate lines, and a second part located in a different layer from the gate lines, the second part intersecting the gate lines and connecting the first parts with each other.

The second part may be located in a same layer as the pixel electrodes.

The storage electrode lines may include at least one branch that is adjacent to the gate lines and extends substantially parallel to the gate lines.

A boundary of each pixel electrode may be located on the at least one branch of a storage electrode line.

The storage electrode lines may be substantially parallel to the gate lines and arranged alternately with the gate lines, the storage electrode lines being located in a same layer as the gate lines.

The thin film transistors may include each a drain electrode overlapping a storage electrode line.

A boundary of each pixel electrode may be located on a storage electrode line.

Each pixel electrode may cover a gate line.

The data lines and the pixel electrodes may overlap each other.

The liquid crystal display may further include an organic layer formed between the pixel electrodes and the data lines and between the pixel electrodes and the gate lines.

The thin film transistor may include a gate electrode connected to a gate line, a source electrode connected to a data line, and a drain electrode connected to a pixel electrode, wherein the source electrode and the drain electrode have a substantially bilateral symmetry.

A length of the first side may be three times the length of the second side.

The liquid crystal display may further include a gate driver connected to the gate lines, wherein the gate driver includes a first gate driving circuit connected to first gate lines, and a second gate driving circuit connected to second gate lines, wherein the first and second gate driving circuits are located in a same layer as the gate lines, the data lines, and the thin film transistors.

The first gate driving circuit and the second gate driving circuit may be disposed opposite each other with respect to the substrate.

BRIEF DESCRIPTION OF THE DRAWINGS

Exemplary embodiments of the present invention can be understood in detail from the following description taken in conjunction with the accompanying drawings of which.

DESCRIPTION OF EXEMPLARY EMBODIMENTS

Exemplary embodiments of the present invention will be described in detail with reference to the accompanying drawings. The present invention may, however, be embodied in many different forms and should not be construed as limited to the embodiments set forth herein.

An LCD according to an exemplary embodiment of the present invention is described with reference to FIG. 1 and FIG. 2.

Figure 1:
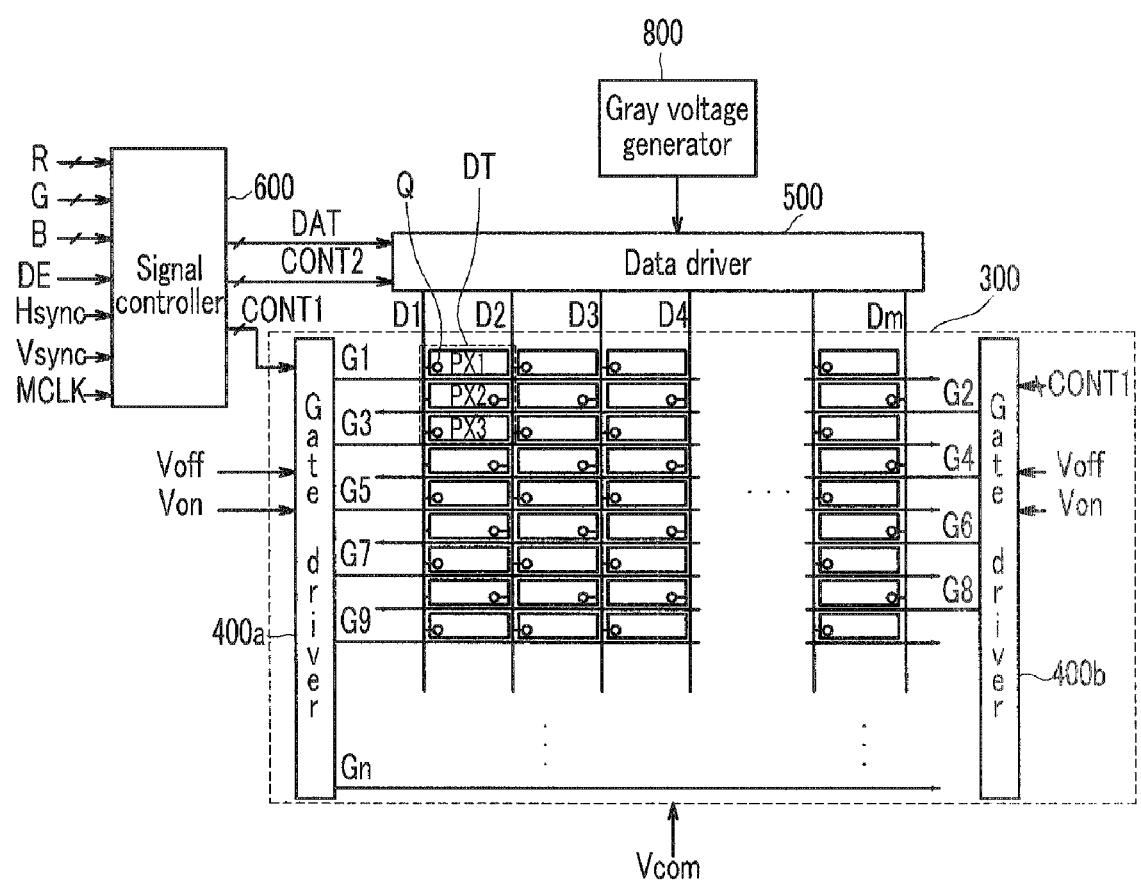
FIG. 1 is a block diagram of an LCD according to an exemplary embodiment of the present invention.

FIG. 1 is a block diagram of an LCD according to an exemplary embodiment of the present invention. FIG. 2 is a circuit diagram of a pixel of an LCD according to an exemplary embodiment of the present invention.

Figure 2:
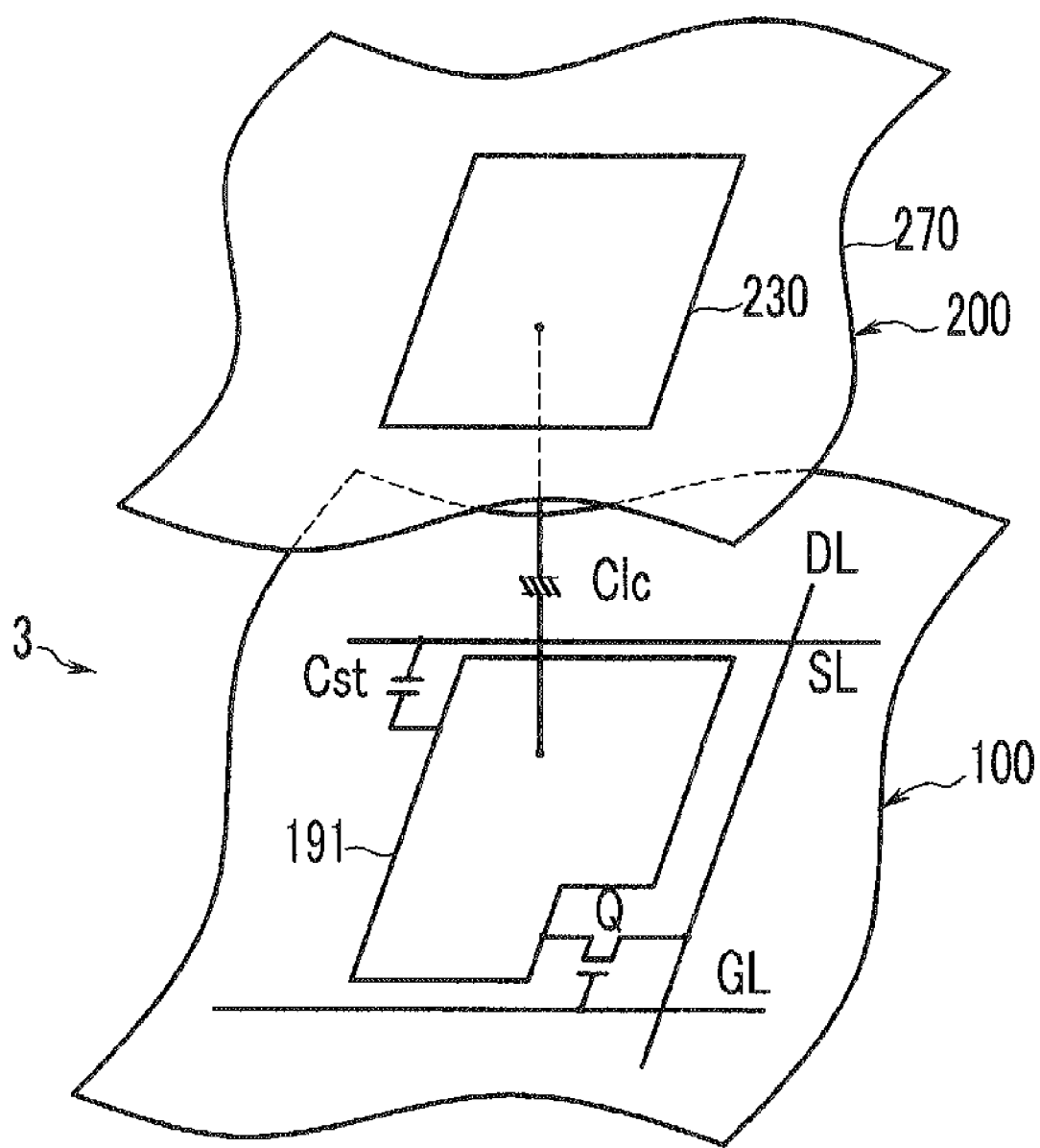
FIG. 2 is a circuit diagram of a pixel of an LCD according to an exemplary embodiment of the present invention.

Referring to FIG. 1 and FIG. 2, an LCD according to an exemplary embodiment of the present invention includes a liquid crystal panel assembly 300, a pair of gate drivers 400*a* and 400*b* and a data driver 500 that are connected to the liquid crystal panel assembly 300, a gray voltage generator 800 connected to the data driver 500, and a signal controller 600 for controlling the above components.

The liquid crystal panel assembly 300 includes, for example, a plurality of display signal lines and a plurality of pixels PX1, PX2, and PX3 connected to the display signal lines and arranged substantially in a matrix. The liquid crystal panel assembly 300 includes, for example, lower and upper panels 100 and 200 that face each other with a liquid crystal layer 3 interposed therebetween.

The signal lines G1-Gn and D1-Dm include a plurality of gate lines G1-Gn for transmitting gate signals (also referred to as "scanning signals") and a plurality of data lines D1-Dm for transmitting data signals. The gate lines G1-Gn extend substantially in a row direction and substantially parallel to each other. The data lines D1-Dm extend substantially in a column direction and substantially parallel to each other.

Each pixel PX1, PX2, and PX3 has a substantially rectangular shape elongated in the row direction. Each pixel PX1, PX2, and PX3, includes a switching element Q connected to the signal lines GL and DL, a liquid crystal capacitor Clc, and a storage capacitor Cst that are connected to the switching element Q.

In an embodiment of the present invention, the storage capacitor Cst may be omitted.

The switching element Q including a thin film transistor can be a three-terminal component provided on the lower panel 100, wherein the control terminal is connected to the gate line GL, the input terminal is connected to the data line DL, and the output terminal is connected to the liquid crystal capacitor Clc and the storage capacitor Cst. Referring to FIG. 1, each column of pixels is adjacent to two data lines, and the pixels PX1, PX2, and PX3 in the column of pixels are connected to the two data lines alternately. In other words, in each column of pixels, the switching elements Q of adjacent pixels PX1, PX2, and PX3 are connected to different data lines D1-Dm from each other.

The liquid crystal capacitor Clc includes a pixel electrode 191 provided on the lower panel 100 and the common electrode 270 provided on the upper panel 200 as two terminals of the liquid crystal capacitor Clc. The liquid crystal layer 3 disposed between the two electrodes 191 and 270 functions as a dielectric material of the liquid crystal capacitor Clc. The pixel electrode 191 is connected to the switching element Q, and the common electrode 270 is formed on the surface of the upper panel 200 and is supplied with a common voltage Vcom. In an embodiment of the present invention, the common electrode 270 may be provided on the lower panel 100, and at least one of the two electrodes 191 and 270 may have a stripe or a bar shape.

The storage capacitor Cst, functioning as an auxiliary capacitor for the liquid crystal capacitor Clc, is formed by overlapping a signal line (not shown) provided on the lower panel 100 with the pixel electrode 191 via an insulator disposed therebetween. The signal line is supplied with a predetermined voltage such as a common voltage Vcom. Alternatively, the storage capacitor Cst may be formed by overlapping the pixel electrode 191 with a gate line above the pixel electrode 191 via an insulator.

Each pixel PX1-PX3 can display one of the primary colors (spatial division). Each pixel PX1-PX3 can sequentially display the primary colors in turn (temporal division). A spatial or temporal sum of the primary colors can be recognized as a desired color. An example set of the primary colors can be three primary colors including red, green, and blue. FIG. 2 shows an example of the spatial division in which each pixel PX1-PX3 includes a color filter 230 representing one of the primary colors in an area of the upper panel 200 facing the pixel electrode 191. In an embodiment of the present invention, the color filter 230 may be provided on or under the pixel electrode 191 on the lower panel 100. Color filters 230 of the pixels PX1-PX3 that are adjacent to each other in a row direction are connected to each other to extend along the row direction. The color filters 230 representing different colors from each other are arranged alternately in the column direction.

In an embodiment, each color filter 230 may represent one of red, green, and blue colors. A pixel including a red color filter 230 is referred to as a red pixel, a pixel including a green color filter 230 is referred to as a green pixel, and a pixel including a blue color filter 230 is referred to as a blue pixel. Red pixels, blue pixels, and green pixels are disposed sequentially and alternately in the column direction according to an embodiment of the present invention.

Pixels PX1-PX3 representing the three primary colors form a dot DT that is a unit for displaying images.

Referring to FIG. 1, the gate drivers 400*a* and 400*b* are integrated into the liquid crystal panel assembly 300 along with the signal lines G1-Gn and D1-Dm and the thin film transistor switching elements Q. The gate drivers 400*a* and 400*b* are located on the left side and the right side of the liquid crystal panel assembly 300, respectively. The gate drivers 400*a* and 400*b* are alternately connected to the odd-numbered gate lines and the even-numbered gate lines, and apply gate signals comprising a gate-on voltage Von and a gate-off voltage Voff to the gate lines $G_1$-$G_n$. In an embodiment of the present invention, the gate driver 400*a* and 400*b* may be provided on only one side of the assembly 300. In an embodiment of the present invention, the gate drivers 400*a* and 400*b* may be directly mounted on the assembly 300 in the form of IC chips. In an embodiment of the present invention, the gate drivers 400*a* and 400*b* may be mounted on a flexible printed circuit film (not shown) and attached to the liquid crystal panel assembly 300 in a tape carrier package (TCP) form. In an embodiment of the present invention, the gate drivers 400*a* and 400*b* may be mounted on a separate printed circuit board (PCB) (not shown).

At least one polarizer (not shown) for polarizing light can be attached on the outer surface of the liquid crystal panel assembly 300.

The gray voltage generator 800 generates two sets of a plurality of gray voltages (or reference gray voltages) related to the transmittance of the pixels PX1-PX3. Gray voltages of a first set have a positive value with respect to the common voltage Vcom, and gray voltages of a second set have a negative value with respect to the common voltage Vcom.

The data driver 500 is connected to the data lines D1-Dm of the liquid crystal panel assembly 300, and applies data signals selected from the gray voltages that are supplied from the gray voltage generator 800 to the data lines D1-Dm. When the gray voltage generator 800 does not supply voltages for all grays but supplies only the reference gray voltages of a predetermined number, the data driver 500 divides the reference gray voltages to generate gray voltages for all grays and selects data signals from the generated gray voltages. In an embodiment of the present invention, the data driver 500 may be directly mounted on the liquid crystal panel assembly 300 in the form of IC chips. In an embodiment of the present invention, the data driver 500 may be mounted on a flexible printed circuit film (not shown) and attached to the liquid crystal panel assembly 300 in a tape carrier package (TCP) form. In an embodiment of the present invention, the data driver 500 may be mounted on a separate printed circuit board (PCB) (not shown). Alternatively, the data driver 500 may be integrated into the liquid crystal panel assembly 300 along with the signal lines G1-Gn and D1-Dm and the thin film transistor switching elements Q.

The signal controller 600 controls the gate drivers 400a and 400b and the data driver 500.

The signal controller 600 is supplied with input image signals R, G, and B and input control signals for controlling the display of the input image signals R, G, and B from an external graphics controller (not shown). The input image signals R, G, and B include luminance information of respective pixels PX, and the luminance has a predetermined number of, for example, $1024(=2^{10})$, $256(=2^8)$, or $64(=2^6)$ grays. The input control signals include, for example, a vertical synchronization signal Vsync, a horizontal synchronization signal Hsync, a main clock signal MCLK, and a data enable signal DE.

On the basis of the input control signals and the input image signals R, G, and B, the signal controller 600 processes the input image signals R, G, and B for the operating conditions of the liquid crystal panel assembly 300 and generates gate control signals CONT1 and data control signals CONT2. Then, the signal controller 600 transmits the gate control signals CONT1 to the gate drivers 400a and 400b and transmits the processed image signals DAT and the data control signals CONT2 to the data driver 500. The processing of image signals by the signal controller 600 includes an operation of rearranging the input image signals R, G, and B according to the disposition of pixels illustrated, for example, in FIG. 1.

The gate control signals CONT1 include a scanning start signal STV for instructing to start scanning and at least one clock signal for controlling the output time of the gate-on voltage Von. The gate control signals CONT1 may further include an output enable signal OE for defining the duration of the gate-on voltage Von.

The data control signals CONT2 include a horizontal synchronization start signal STH for informing of a start of digital image signal DAT transmission for a row of pixels, a load signal LOAD for instructing to apply analog data signals to the data lines D1-Dm, and a data clock signal HCLK. The data control signals CONT2 may further include an inversion signal RVS for reversing the voltage polarity of the analog data signals with respect to the common voltage Vcom (the "voltage polarity of the data signals with respect to the common voltage Vcom" is referred to as "polarity of the data signals").

Responding to the data control signals CONT2 from the signal controller 600, the data driver 500 sequentially receives the digital image signals DAT for a row of pixels PX and selects gray voltages corresponding to the respective digital image signals DAT, thereby converting the digital image signals DAT into analog data signals, which are applied to the corresponding data lines D1-Dm.

The gate drivers 400a and 400b apply the gate-on voltage Von to the gate lines G1-Gn in response to the gate control signals CONT1 from the signal controller 600, thereby turning on the switching elements Q connected to the gate lines G1-Gn.

Then, data signals applied to the data lines D1-Dm are applied to the corresponding pixels PX through the turned-on switching elements Q.

For example, the difference between the voltage of the data signal applied to the pixel PX and the common voltage Vcom appears as a charged voltage of the liquid crystal capacitor Clc. The charged voltage can be referred to as a pixel voltage. The arrangement of the liquid crystal molecules varies depending on the intensity of the pixel voltages. Thus the polarization of light passing through the liquid crystal layer 3 varies. This variation of the light polarization causes a change of light transmittance by the polarizers attached to the liquid crystal panel assembly 300. Thus, the pixels PX display images having the luminance represented by the grays of the image signals DAT.

By repeating this procedure by a unit of the horizontal period (which can be denoted as "1H" and can be substantially equal to one period of the horizontal synchronization signal Hsync and the data enable signal DE), all gate lines G1-Gn are sequentially supplied with the gate-on voltage Von, thereby applying the data signals to all pixels PX to display an image for a frame.

When one frame is finished, the next frame starts. The inversion signal RVS applied to the data driver 500 can be controlled such that the polarity of the data signals applied to the respective pixels PX can be reversed to be opposite to the polarity in the previous frame (which is referred to as "frame inversion"). In an embodiment, even in one frame, the polarity of the data signals flowing in a data line may vary (for example, row inversion and dot inversion) or the polarities of the data signals applied to the pixels in a row may be different from each other (for example, column inversion and dot inversion) in accordance with the characteristics of the inversion signal RVS.

When adjacent pixels, for example, pixels PX1, PX2, and PX3 in each column of pixels are connected to the opposite data lines, the polarities of pixel voltages of the adjacent pixels PX1, PX2, and PX3 in the row direction and the column direction are opposite to each other if the data driver 500 applies data voltages having opposite polarities to the adjacent data lines in the form of column inversion while the polarities are unchanged during a frame. That is, an apparent inversion appearing at the screen becomes the dot inversion.

Figure 3:
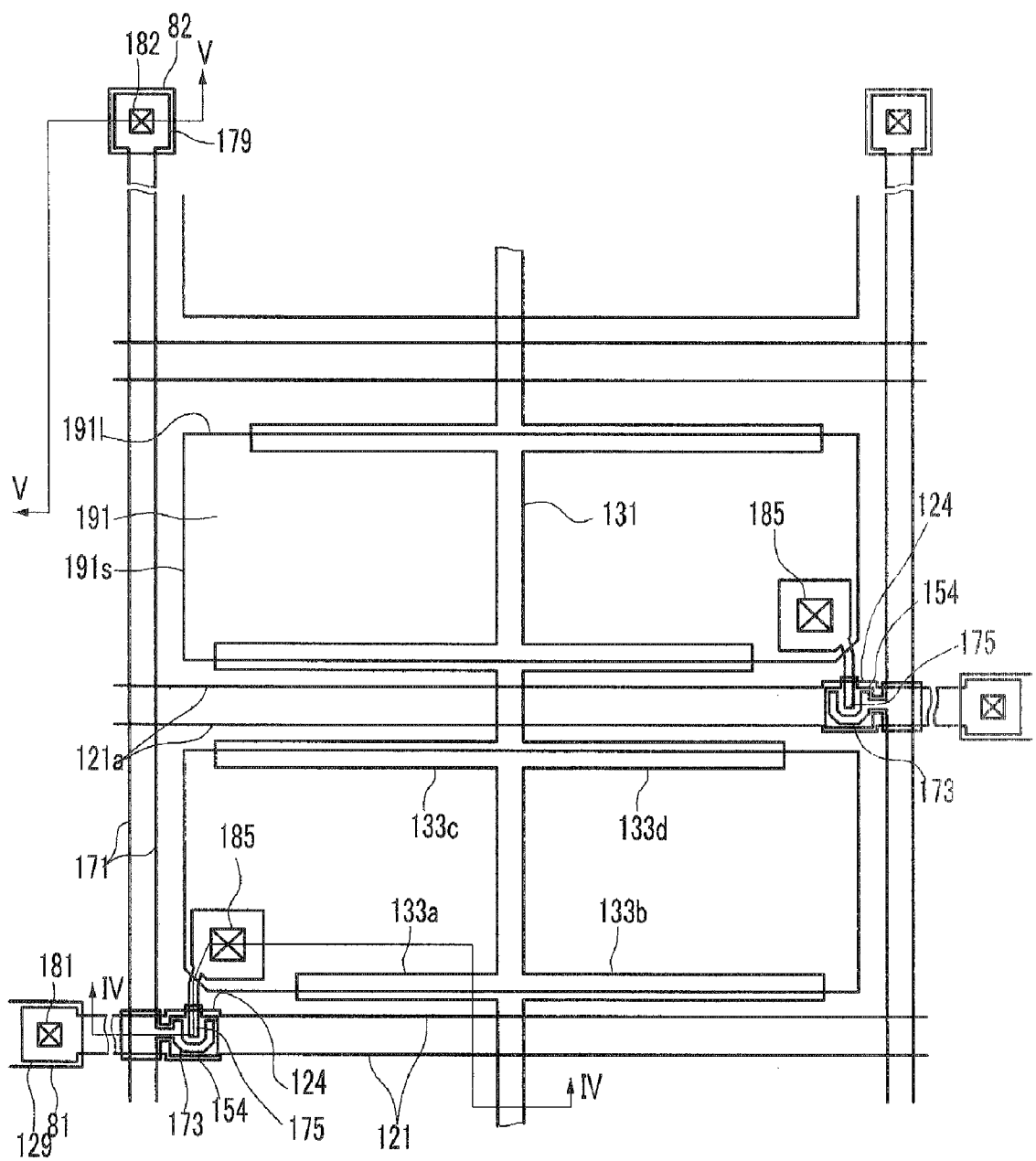
FIG. 3 is a layout view of an LCD according to an exemplary embodiment of the present invention.
Figure 4:
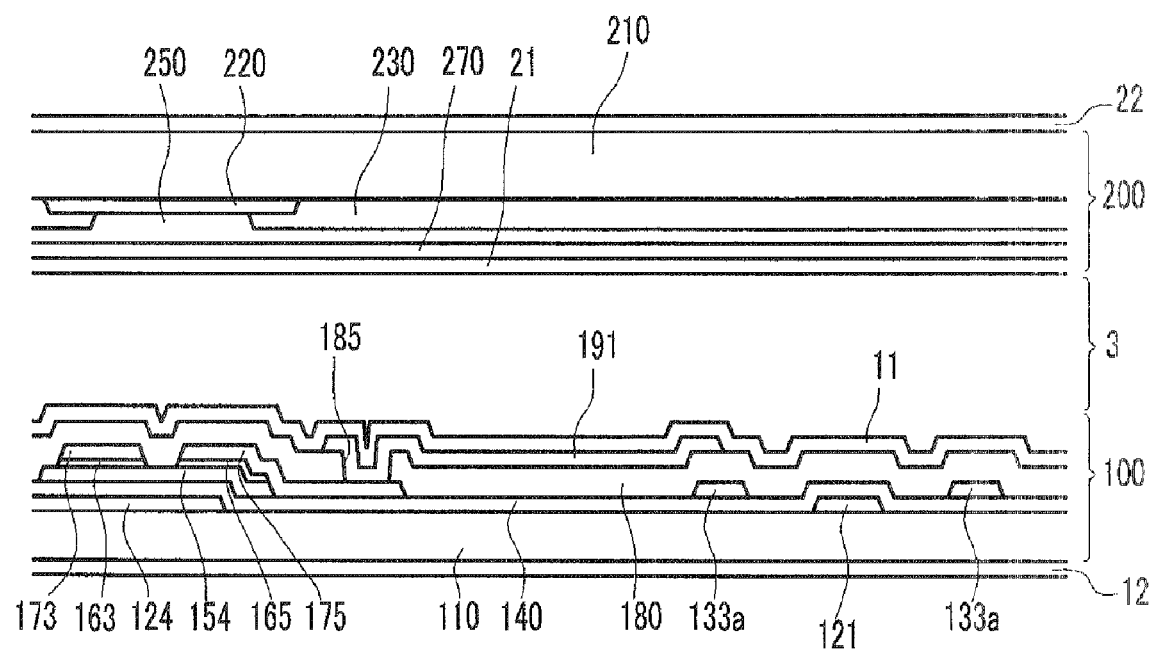
FIG. 4 and FIG. 5 are cross-sectional views of an LCD taken along the line IV-IV and the line V-V in FIG. 3, respectively.
Figure 5:
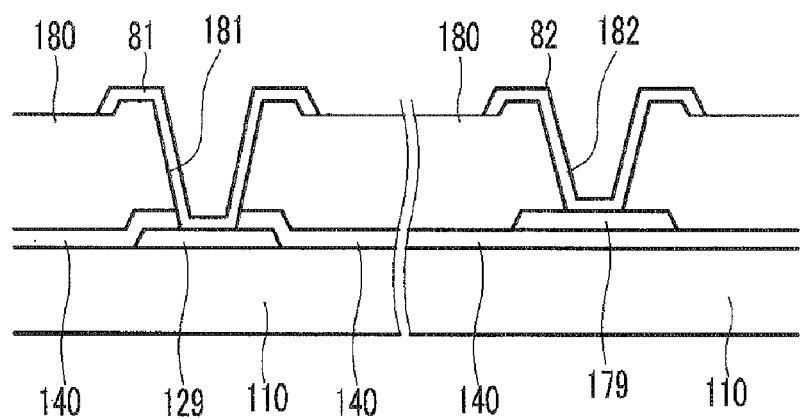

FIG. 3 is a layout view of a liquid crystal panel assembly according to an exemplary embodiment of the present invention. FIG. 4 and FIG. 5 are cross-sectional views of a liquid crystal panel assembly taken along the line IV-IV and the line V-V in FIG. 3, respectively.

Referring to FIG. 3 to FIG. 5, a liquid crystal panel assembly according to an exemplary embodiment of the present invention includes a thin film transistor array panel 100, a common electrode panel 200, and a liquid crystal layer 3 interposed between the two panels 100 and 200.

A plurality of gate lines 121 are formed on an insulating substrate 110, comprising, for example, transparent glass or plastic.

The gate lines 121 for transmitting gate signals extend substantially in a transverse direction. Each gate line 121 includes a plurality of gate electrodes 124 that protrude upwardly or downwardly and an end portion 129 having a large enough area for connection with another layer or an external driving circuit.

The gate lines 121 may comprise, for example, an aluminum-(Al) containing metal such as Al and an Al alloy, a silver-(Ag) containing metal such as Ag and a Ag alloy, a copper-(Cu) containing metal such as Cu and a Cu alloy, a molybdenum-(Mo) containing metal such as Mo and a Mo alloy, chromium (Cr), tantalum (Ta), and titanium (Ti). In an embodiment of the present invention, the gate lines 121 may have a multi-layered structure including two conductive layers (not shown) having different physical properties. One of the two conductive layers may comprise a low resistivity metal such as, for example, an Al-containing metal, an Ag-containing metal, or a Cu-containing metal for reducing signal delay or voltage drop. In an embodiment of the present invention, the other conductive layer may comprise a material such as, for example, a Mo-containing metal, Cr, Ti, and Ta, which has good physical, chemical, and electrical contact characteristics with other materials such as, for example, indium tin oxide (ITO) or indium zinc oxide (IZO). Examples of the combination of two layers include a pair of a lower Cr layer and an upper Al (alloy) layer, and a pair of a lower Al (alloy) layer and an upper Mo (alloy) layer. According to embodiments of the present invention, the gate lines 121 may comprise various metals or conductors.

The lateral sides of the gate lines 121 are inclined with respect to a surface of the substrate 110, and the inclination angle thereof ranges from about 30 degrees to about 80 degrees according to an embodiment of the present invention.

A gate insulating layer 140 comprising, for example, silicon nitride (SiNx) or silicon oxide (SiOx) is formed on the gate lines 121.

A plurality of semiconductor islands ("semiconductors") 154 comprising, for example, hydrogenated amorphous silicon ("a-Si") or polysilicon are formed on the gate insulating layer 140. Each semiconductor 154 is disposed on the gate electrode 124. A plurality of ohmic contact islands ("ohmic contacts") 163 and 165 are formed on the semiconductors 154. The ohmic contacts 163 and 165 may comprise, for example, n+ hydrogenated a-Si heavily doped with an n-type impurity such as phosphorus (P), or silicide. The ohmic contacts 163 and 165 are disposed in pairs on the semiconductors 154.

The lateral sides of the semiconductors 154 and the ohmic contacts 163 and 165 are inclined with respect to a surface of the substrate 110. The inclination angle thereof ranges from about 30 degrees to about 80 degrees according to an embodiment of the present invention.

A plurality of data lines 171, a plurality of drain electrodes 175, and a plurality of storage electrode lines 131 are formed on the ohmic contacts 163 and 165 and the gate insulating layer 140.

The data lines 171 for transmitting data signals extend substantially in the longitudinal direction and intersect the gate lines 121. Each data line 171 includes a plurality of source electrodes 173 branched toward the gate electrodes 124 and an end portion 179 having a large enough area for connection with another layer or an external driving circuit.

The data driving circuit (not shown) for generating data signals may be mounted on a flexible printed circuit film (not shown) attached to the substrate 110. In an embodiment of the present invention, the driving circuit may be directly mounted on the substrate 110. In an embodiment of the present invention, the driving circuit may be integrated with the substrate 110. When the data driving circuit is integrated on the substrate 110, the data lines 171 may be extended and directly connected to the data driving circuit.

Each drain electrode 175 is separated from the data line 171, and is formed opposite a source electrode 173 with respect to a gate electrode 124. Each drain electrode 175 has an end portion having a large enough area and another stick-shaped end portion. The stick-shaped end portion is partially surrounded by the source electrode 173 in a "U" shape. The source electrode 173 and the drain electrode 175 have a substantially bilateral symmetry.

The gate electrode 124, the source electrode 173, and the drain electrode 175, along with a semiconductor 154, form a thin film transistor (TFT) having a channel formed in the semiconductor 154 disposed between the source electrode 173 and the drain electrode 175.

The storage electrode lines 131 are supplied with a predetermined voltage such as the common voltage. Each of the storage electrode lines 131 includes a stem extending substantially parallel to the data lines 171 and a plurality of storage electrodes 133a, 133b, 133c and 133d branched from the stem. The storage electrodes 133a-133d extend parallel with the gate lines 121 to both sides from the stem and are formed near the gate lines 121. In embodiments of the present invention, the shapes and dispositions of the storage electrode lines 131 may be modified in various ways.

The data lines 171, the drain electrodes 175, and the storage electrode lines 131 may comprise a refractory metal such as, for example, Mo, Cr, Ta, and Ti or an alloy thereof. The data lines 171, the drain electrodes 175, and the storage electrode lines 131 may have a multi-layered structure including, for example, a refractory metal layer (not shown) and a conductive layer (not shown) having low resistivity. An example of the multi-layered structure includes a double-layered structure including a lower Cr or Mo (alloy) layer and an upper Al (alloy) layer, and a triple-layered structure including a lower Mo (alloy) layer, an intermediate Al (alloy) layer, and an upper Mo (alloy) layer. In embodiments of the present invention, the data lines 171, the drain electrodes 175, and the storage electrode lines 131 may comprise various metals or conductive materials.

The lateral sides of the data lines 171, the drain electrodes 175, and the storage electrode lines 131 can be inclined with respect to a surface of the substrate 110. The inclination angles thereof can be in a range of about 30 degrees to about 80 degrees according to an embodiment of the present invention.

The ohmic contacts 163 and 165 are interposed between the underlying semiconductors 154 and the overlying data lines 171 and the drain electrodes 175. The ohmic contacts 163 and 165 reduce the contact resistance therebetween. The semiconductors 154 include exposed portions which are not covered with the data line 171 and the drain electrode 175 such as the portion located between the source electrode 173 and the drain electrode 175.

A passivation layer 180 is formed on the data lines 171, the drain electrodes 175, and the exposed portions of the semiconductors 154. The passivation layer 180 may comprise an inorganic insulator such as, for example, silicon nitride or silicon oxide. Alternatively, the passivation layer 180 may comprise an organic insulator, and the surface thereof may be flat. The organic insulator may have photosensitivity, and the dielectric constant thereof can be lower than about 4.0 in an embodiment of the present invention. The passivation layer 180 may have a double-layered structure, including a lower inorganic layer and an upper organic layer, to reduce damage to the exposed portions of the semiconductors 154 and to enhance insulating characteristics of an organic layer.

The passivation layer 180 has a plurality of contact holes 182 and 185 respectively exposing the end portions 179 of the data lines 171 and the drain electrodes 175. The passivation layer 180 and the gate insulating layer 140 have a plurality of contact holes 181 exposing the end portions 129 of the gate lines 121.

A plurality of pixel electrodes 191, a plurality of connecting members 81, and a plurality of contact assistants 82 are formed on the passivation layer 180. These components may comprise, for example, a transparent conductive material such as ITO and IZO, or a reflective metal such as Al, Ag, Cr, or an alloy thereof.

Each pixel electrode 191 has four major sides that are substantially parallel to the gate lines 121 or the data lines 171. The length of the two transverse sides 191*l* that are parallel to the gate lines 121 is substantially longer, for example, by three times, than the length of the two longitudinal sides 191*s* that are parallel to the data lines 171. Compared to when the transverse sides are shorter than the longitudinal sides, the number of pixel electrodes 191 located in each row is fewer, and the number of pixel electrodes 191 located in each column is greater. Accordingly, since the number of the data lines 171 is decreased, the number of IC chips for the data driver 500 can be reduced. The gate drivers 400*a* and 400*b* can be integrated into the assembly 300 along with the gate lines 121, data lines 171, and the TFTs according to an embodiment of the present invention.

The pixel electrode 191 is physically and electrically connected with the drain electrode 175 through the contact hole 185, and receives a data voltage from the drain electrode 175. The pixel electrode 191 receiving a data voltage generates an electric field in cooperation with the common electrode 270 on the common electrode panel 200 supplied with a common voltage. The orientations of the liquid crystal molecules in the liquid crystal layer 3 interposed between the two electrodes 191 and 270 are determined using the electric field. In accordance with the determined orientations of the liquid crystal molecules, the polarization of light passing through the liquid crystal layer 3 is varied. The pixel electrode 191 and the common electrode 270 form a liquid crystal capacitor to store and to preserve the applied voltage even after the TFT is turned off.

The pixel electrode 191 overlaps the storage electrode line 131 including the storage electrodes 133*a*-133*d* to form a storage capacitor that enhances the voltage storing capacity of the liquid crystal capacitor. In an embodiment of the present invention, the stem of the storage electrode line 131 traverses across the middle of the pixel electrode 191 in a longitudinal direction. The top and bottom boundaries of the pixel electrode 191 are located on the storage electrodes 133*a*-133*d* extending to the right and left from the stem. In an embodiment of the present invention, electromagnetic interference between the gate line 121 and the pixel electrode 191 can be blocked by the storage electrodes 133*a*-133*d*, thereby stably maintaining the voltage of the pixel electrode 191. In this structure, the conducting wire in the longitudinal direction is decreased as compared to a structure in which the storage electrodes 133*a*-133*d* are disposed at the left and right boundaries of the pixel electrode 191. Thus the transverse width of pixels is reduced such that sufficient space for integrating gate drivers 400*a* and 400*b* can be generated. The storage electrodes 133*a*-133*d* can block light leakage between the pixel electrodes 191. A step difference caused by disposing the stem of the storage electrode line 131 in the middle of the pixel electrode 191 can be compensated by making a slight inclination of the lateral sides of the storage electrode line 131.

Each contact assistant 82 is connected to the end portion 179 of the data line 171 through the contact hole 182. The contact assistants 82 supplement the adhesive property of the end portions 179 of the data lines 171 to exterior devices, and protect the exterior devices.

Each connecting member 81 is connected to an end portion 129 of the gate line 121 through the contact hole 181. The connecting members 81 connect the end portions 129 of the gate lines 121 to the gate drivers 400*a* and 400*b*. If the gate drivers 400*a* and 400*b* are in the form of IC chips, the connecting members 81 may have substantially similar shapes and functions with the contact assistants 82.

A light blocking member 220 is formed on an insulating substrate 210 comprising, for example, transparent glass or plastic. The light blocking member 220 can be referred to as a black matrix, and prevents light leakage.

A plurality of color filters 230 are formed on the substrate 210 and the light blocking member 220. The color filters 230 are disposed substantially in the regions enclosed by the light blocking member 220, and may extend along a transverse direction substantially along the rows of pixel electrodes 191. Each of the color filters 230 may represent one of the primary colors such as red, green, and blue.

An overcoat 250 is formed on the color filters 230 and the light blocking member 200. The overcoat 250 may comprise, for example, an organic insulator. The overcoat 250 prevents the color filters 230 from being exposed and provides a flat surface. The overcoat 250 may be omitted according to an embodiment of the present invention.

Alignment layers 11 and 21 are coated on inner surfaces of the panels 100 and 200. The alignment layers 11 and 21 may be vertical alignment layers. Polarizers 12 and 22 are provided on outer surfaces of the panels 100 and 200. Polarization axes of the polarizers 12 and 22 may be parallel or perpendicular to each other. One of the two polarizers may be omitted when the LCD is a reflective type LCD according to an embodiment of the present invention.

An LCD according to an exemplary embodiment may further include a retardation film (not shown) for compensating the retardation of the liquid crystal layer 3. The LCD may further include a backlight unit (not shown) for supplying light to the polarizers 12 and 22, the retardation film, the panels 100 and 200, and the liquid crystal layer 3.

The liquid crystal layer 3 is in a state of positive or negative dielectric anisotropy. The liquid crystal molecules in the liquid crystal layer 3 are aligned such that their long axes are substantially parallel or vertical to the surfaces of the panels 100 and 200 in the absence of an electric field.

An LCD according to an exemplary embodiment of the present invention is described with reference to FIG. 6 and FIG. 7.

Figure 6:
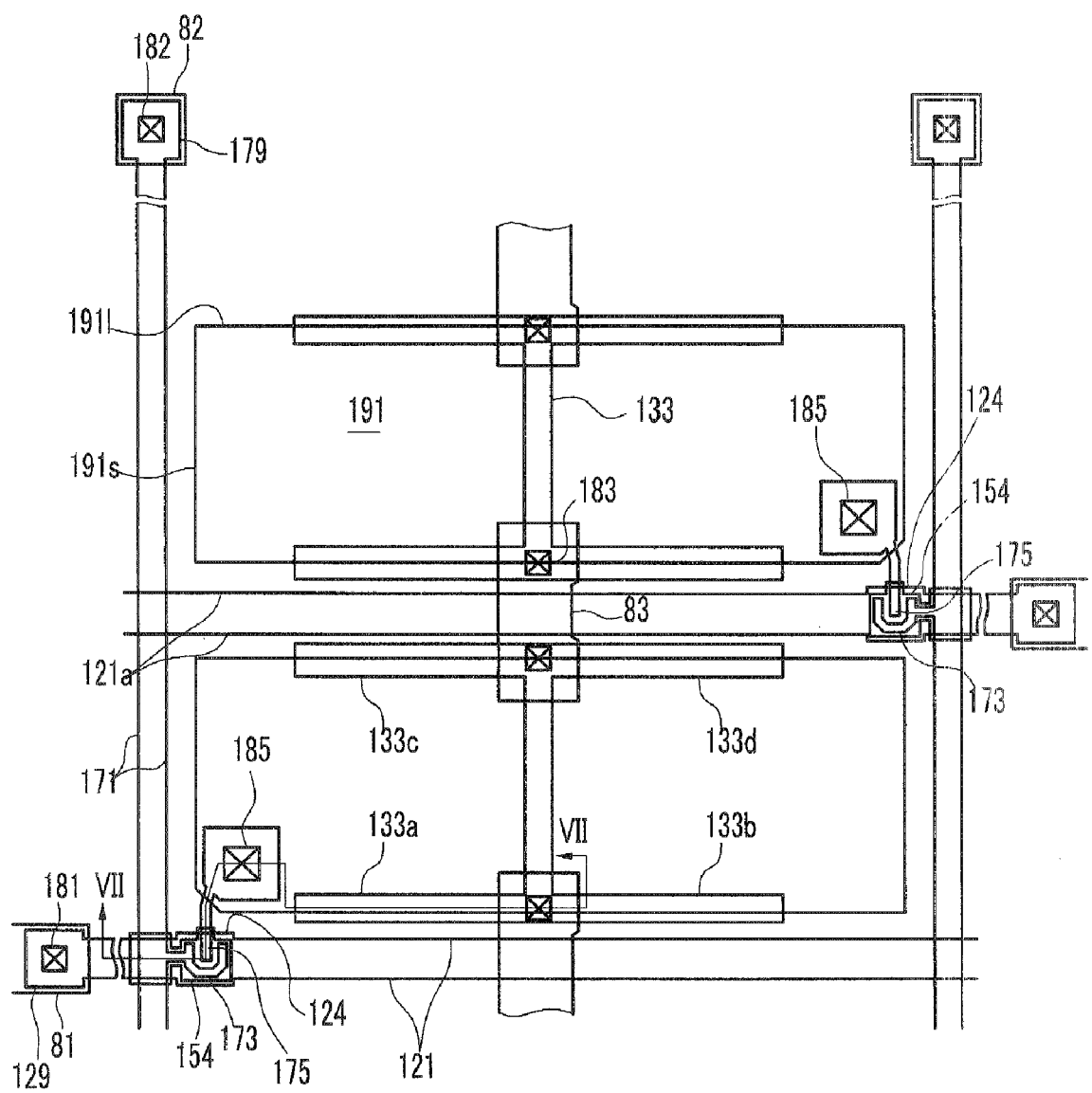
FIG. 6 is a layout view of an LCD according to an exemplary embodiment of the present invention.

FIG. 6 is a layout view of an LCD according to an exemplary embodiment of the present invention. FIG. 7 is a cross-sectional view of an LCD taken along the line VII-VII in FIG. 6.

Figure 7:
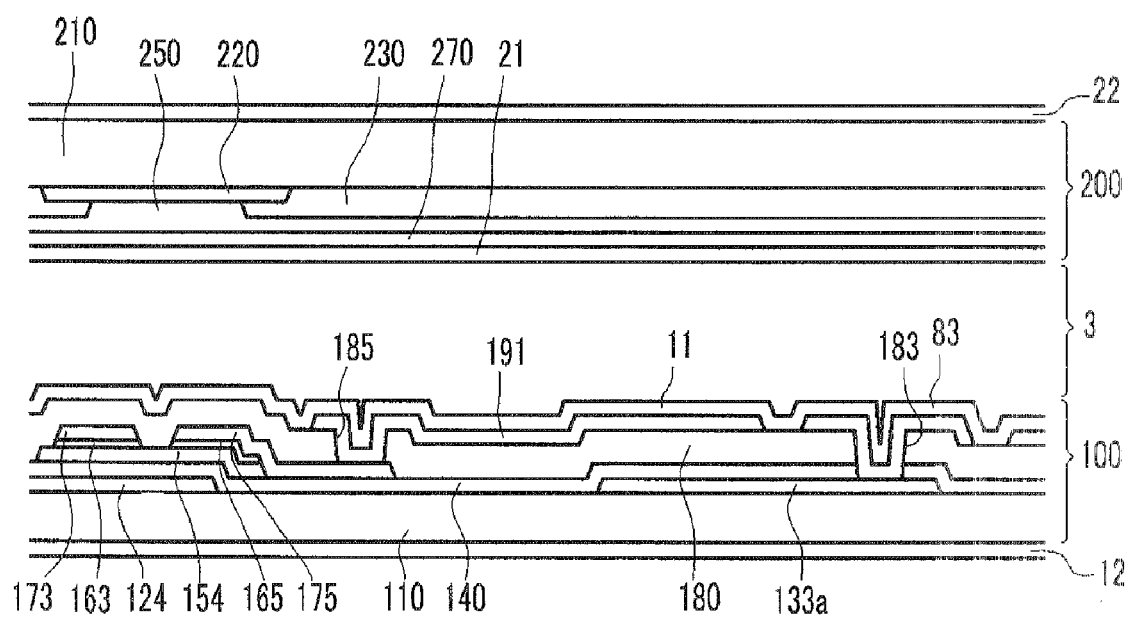
FIG. 7 is a cross-sectional view of an LCD taken along the line VII-VII in FIG. 6.

Referring to FIG. 6 and FIG. 7, an LCD according to an exemplary embodiment includes the TFT array panel 100, the common electrode panel 200, the liquid crystal layer 3 interposed between the two panels 100 and 200, and polarizers 12 and 22 attached to outer surfaces of the two panels 100 and 200.

The plurality of gate lines 121 and the plurality of storage electrodes 133 are formed on the substrate 110. Each gate line 121 includes the plurality of gate electrodes 124 that protrude upwardly and downwardly, and the end portion 129 having a large enough area for connection with another layer or the gate driver 400a or 400b. Each storage electrode 133 includes a stem portion extending substantially perpendicular to the gate line 121, and branch portions 133a-133d extending to the left and right from the stem portion.

The gate insulating layer 140, the plurality of semiconductor islands 154 having projections, and the plurality of ohmic contact islands 163 and 165 are sequentially formed on the gate lines 121 and the storage electrodes 133. The plurality of data lines 171 including source electrodes 173 and end portions 179 are formed on the ohmic contacts 163 and 165 and the gate insulating layer 140, and a passivation layer 180 is formed thereon.

The passivation layer 180 has the plurality of contact holes 182 and 185 respectively exposing the end portions 179 of the data lines 171 and the drain electrodes 175. The passivation layer 180 and the gate insulating layer 140 have the plurality of contact holes 181 exposing the end portions 129 of the gate lines 121 and a plurality of contact holes 183 exposing a substantially center portion of the branch portions 133a-133b and a substantially center portion of the branch portions 133c and 133e at the storage electrodes 133.

The plurality of pixel electrodes 191, a plurality of overpasses 83, the plurality of connecting members 81, and the plurality of contact assistants 82 are formed on the passivation layer 180.

The overpasses 83 cross over the gate lines 121. The overpasses 83 are connected to the storage electrodes 133 through the contact holes 183 that are disposed opposite each other with respect to the gate lines 121. The overpasses 83 form a storage electrode line along with the storage electrodes 133.

The light blocking member 220, the color filters 230, the overcoat 250, the common electrode 270, and the alignment layer 21 are sequentially formed on an insulating substrate 210.

An LCD according to an exemplary embodiment of the present invention is described with reference to FIG. 8 and FIG. 9.

Figure 8:
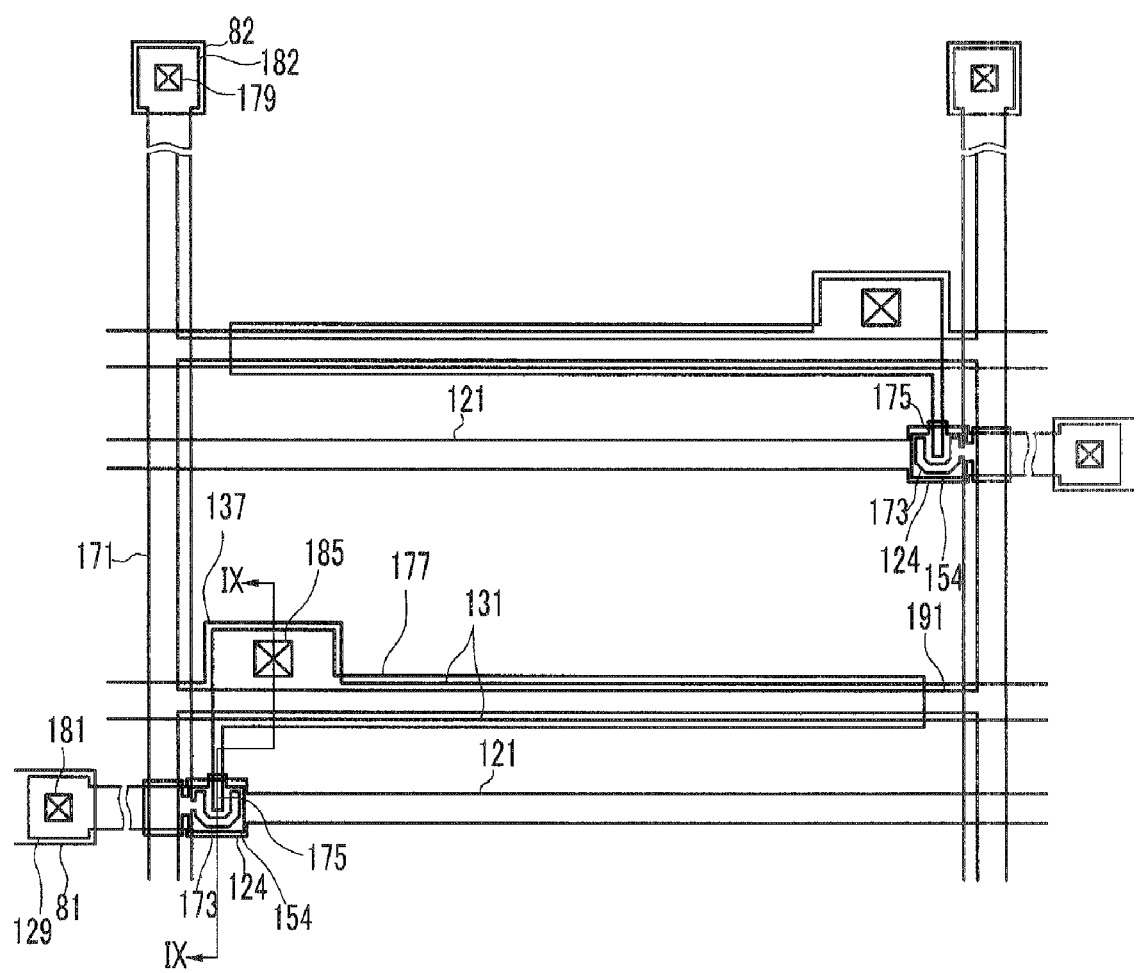
FIG. 8 is a layout view of an LCD according to an exemplary embodiment of the present invention.

FIG. 8 is a layout view of an LCD according to an exemplary embodiment of the present invention. FIG. 9 is a cross-sectional view of an LCD taken along the line IX-IX in FIG. 8.

Figure 9:
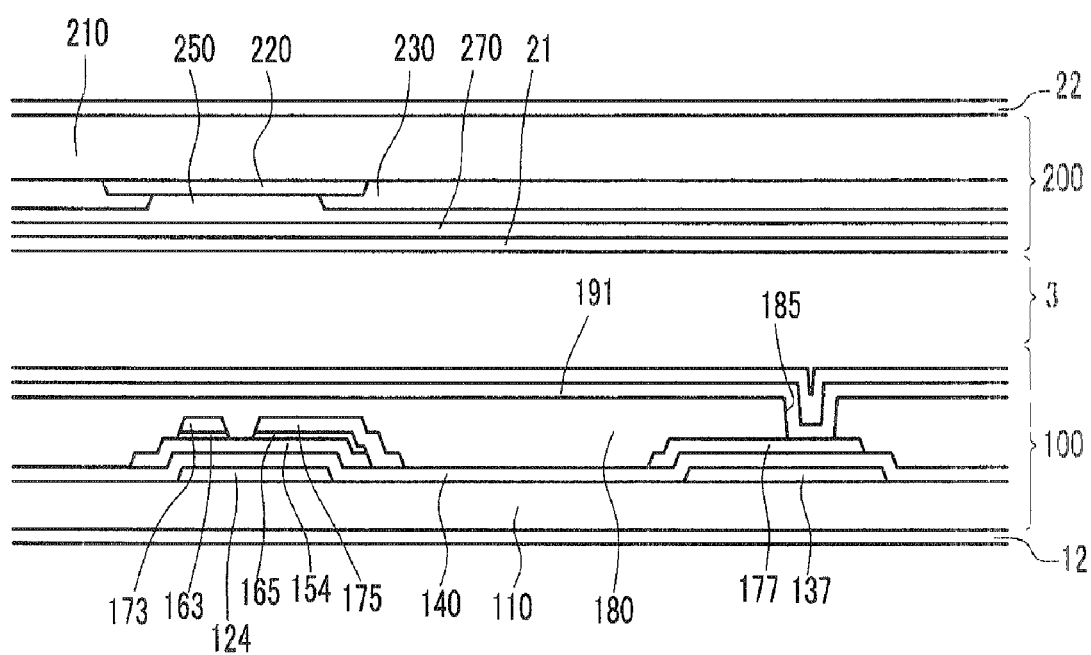
FIG. 9 is a cross-sectional view of an LCD taken along the line IX-IX in FIG. 8.

Referring to FIG. 8 and FIG. 9, the plurality of gate lines 121 including the gate electrodes 124 and the plurality of storage electrode lines 131 are formed on the insulating substrate 110 comprising, for example, transparent glass or plastic.

The storage electrode line 131 is supplied with a predetermined voltage, and extends substantially parallel to the gate line 121. Each storage electrode line 131 is disposed between two adjacent gate lines 121 and is formed near the lower one of the two gate lines 121. The storage electrode line 131 includes an expansion 137 extending upwardly.

The gate insulating layer 140, the plurality of semiconductor islands 154, and the plurality of ohmic contact islands 163 and 165 are sequentially formed on the gate lines 121 and the storage electrode lines 131.

The plurality of data lines 171 including the source electrodes 173 and the end portions 179, and the plurality of drain electrodes 175 are formed on the ohmic contacts 163 and 165 and the gate insulating layer 140. The drain electrode 175 may include a stick-shaped end portion, an expansion 177 connected to the stick-shaped end portion, and a transverse portion extending in a transverse direction from the expansion 177 and overlapping the storage electrode line 131.

The passivation layer 180 is formed on the data lines 171, the drain electrodes 175, and the exposed portions of the semiconductors 154. The dielectric constant of the passivation layer 180 may be low in a range of about 3 to about 3.5. The passivation layer 180 may comprise an organic insulator that is relatively thick and the surface thereof may be flat.

The passivation layer 180 has the plurality of contact holes 182 and 185 respectively exposing the end portions 179 of the data lines 171 and the drain electrodes 175. The passivation layer 180 and the gate insulating layer 140 have the plurality of contact holes 181 exposing the end portions 129 of the gate lines 121.

The plurality of pixel electrodes 191 and the plurality of contact assistants 81 and 82 are formed on the passivation layer 180. Each pixel electrode 191 overlaps a gate line above each pixel electrode 191 to form a storage capacitor. Each pixel electrode 191 partially overlaps each data line 171 to increase the aperture ratio. Since the dielectric constant of the passivation layer 180 is low and the thickness thereof is large, the parasitic capacitance generated by overlapping each pixel electrode 191, each gate line 121, and each data line 171 can be reduced.

The alignment layer 11 is formed on the pixel electrodes 191 and the passivation layer 180.

The light blocking member 220, the color filters 230, the overcoat 250, the common electrode 270, and the alignment layer 21 are sequentially formed on the insulating substrate 210.

According to an embodiment of the present invention, the number of data lines and data drivers can be reduced.

Although exemplary embodiments have been described with reference to the accompanying drawings, it is to be understood that the present invention is not limited to these precise embodiments but various changes and modifications can be made by one skilled in the art without departing from the spirit and scope of the present invention. All such changes and modifications are intended to be included within the scope of the invention as defined by the appended claims.

What is claimed is:

1. A liquid crystal display comprising:
a substrate;
a plurality of gate lines formed on the substrate and extended in a first direction;
a plurality of data lines intersecting the plurality of gate lines and extended in a second direction;
a plurality of thin film transistors connected to the plurality of gate lines and the plurality of data lines; and
a plurality of pixel electrodes connected to the plurality of thin film transistors and arranged in a matrix,
wherein each of the pixel electrodes is formed in a substantially rectangular shape elongated in the first direction and includes a first side parallel to each gate line and a second side being formed next to the first side, wherein the length of the first side is about three times longer than the length of the second side,
wherein the plurality of pixel electrodes that are adjacent to each other in the second direction are connected to different data lines from each other.

2. The liquid crystal display of claim 1, further comprising a storage electrode line, wherein at least a portion of the storage electrode line overlaps a pixel electrode.

3. The liquid crystal display of claim 2, wherein the storage electrode line extends perpendicular to a gate line.

4. The liquid crystal display of claim 3, wherein the storage electrode line is located in the same layer as a data line.

5. The liquid crystal display of claim 3, wherein the storage electrode line comprises:
   a plurality of first parts located in the same layer as the gate line and disposed between two adjacent gate lines; and
   a plurality of second parts located in a different layer from the gate line, wherein the plurality of second parts intersect the gate line and connect the plurality of first parts with each other.

6. The liquid crystal display of claim 5, wherein each second part is located in the same layer as the pixel electrode.

7. The liquid crystal display of claim 3, wherein the storage electrode line includes at least one branch being adjacent to one of the plurality of gate lines and extending substantially parallel to the plurality of gate lines.

8. The liquid crystal display of claim 7, wherein a boundary of the pixel electrode is located on the at least one branch of the storage electrode line.

9. The liquid crystal display of claim 2, wherein the storage electrode line is substantially parallel to a gate line and arranged alternately with the gate line, wherein the storage electrode line is located in a same layer as the gate line.

10. The liquid crystal display of claim 9, wherein the thin film transistor comprises a drain electrode overlapping the storage electrode line.

11. The liquid crystal display of claim 9, wherein a boundary of the pixel electrode is located on the storage electrode line.

12. The liquid crystal display of claim 9, wherein the pixel electrode covers a gate line.

13. The liquid crystal display of claim 9, wherein a data line and the pixel electrode overlap each other.

14. The liquid crystal display of claim 13, further comprising an organic layer formed between the pixel electrode and the data line and between the pixel electrode and the gate line.

15. The liquid crystal display of claim 1, wherein a thin film transistor comprises:
    a gate electrode connected to a gate line; a source electrode connected to a data line; and
    a drain electrode connected to a pixel electrode, wherein the source electrode and the drain electrode have a substantially bilateral symmetry.

16. The liquid crystal display of claim 1, further comprising a gate driver connected to the plurality of gate lines, wherein the gate driver comprises:
    a first gate driving circuit connected to first gate lines; and
    a second gate driving circuit connected to second gate lines, wherein the first and the second gate driving circuits are located in a same layer as the plurality of gate lines, the plurality of data lines, and the plurality of thin film transistors.

17. The liquid crystal display of claim 16, wherein the first gate driving circuit and the second gate driving circuit are disposed opposite each other with respect to the substrate.

* * * * *